United States Patent [19]

Horr et al.

[11] Patent Number: 4,600,445
[45] Date of Patent: Jul. 15, 1986

[54] PROCESS FOR MAKING SELF ALIGNED FIELD ISOLATION REGIONS IN A SEMICONDUCTOR SUBSTRATE

[75] Inventors: Robert A. Horr, Fairfax; Rick L. Mohler, Williston, both of Vt.

[73] Assignee: International Business Machines Corporation, Armonk, N.Y.

[21] Appl. No.: 650,389

[22] Filed: Sep. 14, 1984

[51] Int. Cl.[4] .................... H01L 21/22; H01L 21/265
[52] U.S. Cl. ........................................ 148/1.5; 29/571; 29/576 B; 148/187; 156/643; 156/653; 156/654; 357/91
[58] Field of Search .............. 148/1.5, 187; 29/576 B, 29/571; 357/91; 156/643, 653, 654

[56] References Cited

U.S. PATENT DOCUMENTS

| | | | |
|---|---|---|---|
| 4,135,955 | 1/1979 | Gasner et al. | 148/187 |
| 4,144,101 | 3/1979 | Rideout | 148/1.5 |
| 4,244,752 | 1/1981 | Henderson et al. | 148/1.5 |
| 4,280,272 | 7/1981 | Egawa et al. | 29/571 |
| 4,282,648 | 8/1981 | Yu et al. | 29/571 |
| 4,358,340 | 11/1982 | Fu | 156/643 |
| 4,385,947 | 5/1983 | Halfacre et al. | 148/187 |
| 4,391,849 | 7/1983 | Bischoff | 156/643 |
| 4,411,058 | 10/1983 | Chen | 29/571 |
| 4,412,375 | 11/1983 | Mathews | 29/571 |
| 4,419,142 | 12/1983 | Matsukawa | 148/1.5 |
| 4,459,740 | 7/1984 | Schwabe et al. | 29/571 |
| 4,468,852 | 9/1984 | Cerofolini | 29/571 |
| 4,470,191 | 9/1984 | Cottrell et al. | 29/571 |
| 4,473,435 | 9/1984 | Zafirpoulo et al. | 156/643 |
| 4,480,375 | 11/1984 | Cottrell et al. | 29/576 B |
| 4,481,705 | 11/1984 | Haskell | 29/571 |
| 4,484,979 | 11/1984 | Stocker | 156/643 |
| 4,509,991 | 4/1985 | Taur | 148/1.5 |
| 4,533,431 | 8/1985 | Dargent | 156/643 |

Primary Examiner—Upendra Roy
Attorney, Agent, or Firm—Mark F. Chadurjian; George Tacticos

[57] ABSTRACT

A process is provided for making semiconductor structures, such as CMOS structures, which includes forming on a surface of a semiconductor body a layer from a material which is impervious to oxygen diffusion therethrough and patterning this layer to define the position of both the active and field isolation regions by partially removing this layer from the areas where the field isolation regions are to be formed. This oxygen impervious layer may be a dual dielectric structure consisting of a layer of silicon dioxide adjoining the semiconductor body and a layer of silicon nitride adjoining the silicon dioxide. The resulting structure includes an oxygen impervious layer which is used both for protecting all underlying oxidizing regions from oxidation and for defining the position of the active regions of the structure.

12 Claims, 6 Drawing Figures

PROCESS FOR MAKING SELF ALIGNED FIELD ISOLATION REGIONS IN A SEMICONDUCTOR SUBSTRATE

DESCRIPTION

1. Technical Field

The invention relates in general to a process for making semiconductor devices and, more particularly, to a process for making Complementary Metal Oxide Semiconductor ("CMOS") structures.

2. Related Applications

In copending U.S. patent application Ser. No. 564,880, filed on Dec. 23, 1983, and entitled "Process for Fabricating Semiconductor Devices Utilizing A Protective Film During High Temperature Annealing" and assigned to the present assignee, there is described and claimed a novel process for making semiconductor devices which includes the use of a protective layer over the semiconductor structure during certain processing steps involving high temperature annealing in an oxidizing ambient.

In copending U.S. patent application Ser. No. 448,124, filed on Dec. 9, 1982, and entitled "A Simple Process for Making Complementary Transistors" now U.S. Pat. No. 4,480,375, and copending U.S. patent application Ser. No. 448,125, also filed on Dec. 9, 1982, and entitled "Process for Making Complementary Transistors", now U.S. Pat. No. 4,470,191 both assigned to the present assignee, there are disclosed and claimed novel processes for making Complementary Metal Oxide Semiconductor (CMOS) Structures.

BACKGROUND OF THE INVENTION

As the density of active device elements in an Integrated Circuit (IC) increases, so does the importance for electrically isolating adjacent elements in the same substrate. One method for isolating active elements is to provide field isolation regions between adjacent active elements and to provide doped regions within these isolation regions to act as parasitic channel stopping elements. These doped regions eliminate the undesirable conduction due to inversion under the field isolation when lightly doped substrates are used. A process for providing such doped field isolation regions which are also self-aligned to preselected subsequently fabricated active regions is disclosed in U.S. Pat. No. 4,144,101, issued on Mar. 13, 1979 to V. L. Rideout and assigned to the same assignee as the present application.

CMOS circuits use both N channel and P channel devices in the same IC substrate. Conventional processing techniques for making such structures include the formation of single wells or dual wells in preselected portions of a substrate in which individual MOS devices are to be built. U.S. Pat. No. 4,244,752, issued on Jan. 13, 1981 to Henderson, Sr. et al, discloses a process for making CMOS IC's having P-channel and N-channel devices in a P type substrate. A dual dielectric layer of silicon dioxide and silicon nitride is used as a first mask on the surface of the substrate to define the position of the subsequently formed field isolation regions which in turn define the location of the active device regions on the structure. Once the location of the active regions is defined, a second mask is used to form through ion implantation N type well regions for the P channel devices. Using the silicon dioxide-silicon nitride structure as an ion implantation mask the field isolation regions are doped with a P type dopant and subsequently a silicon dioxide layer is grown in these regions for field isolation purposes.

In U.S. Pat. No. 4,385,947, issued on May 31, 1983 to Halfacre et al there is disclosed a method for fabricating CMOS devices in a P type substrate with a single guard ring using local oxidation. The method includes forming a masking layer on a P type silicon substrate having a thin layer of silicon dioxide on it. An opening is formed in the masking layer and the underlying silicon dioxide layer is in a preselected position for the formation of an N-well region. An N dopant is then diffused to form the N-well region. A second masking layer is then formed from an oxide inhibiting material, such as silicon nitride, and patterned to define the position in which the CMOS active regions are to be formed. This layer is then removed from all but location reserved for the active regions. A third masking layer, which may be made from a photoresist material is formed over the structure and patterned to expose the regions preselected for guard ring regions. These regions are then formed through implantation with a P type dopant material. The third masking layer is then removed. The substrate is exposed to an oxidizing atmosphere to grow field oxide on the substrate except on the portions covered by the $Si_3N_4$.

SUMMARY OF THE INVENTION

It is an object of this invention to provide an improved process for making high density semiconductor devices.

It is another object of this invention to provide a process for making CMOS structures with doped field isolation regions which are self aligned to the active regions and the well regions.

These and other objects are achieved by the present invention which comprises forming on a surface of a semiconductor body a layer from a material which is impervious to oxygen diffusion therethrough. A pattern defining the position of the active regions and the field isolation regions is formed on this layer by partially removing it from the areas where the field isolation regions are to be formed. Thus, the resulting structure includes an oxygen impervious layer over the semiconductor body both to protect the underlying oxidizing regions from oxidation during subsequent processing steps and to form on this layer pattern information for subsequent use for the formation and doping of the field isolation regions. This oxygen impervious layer may be a dual dielectric layer of silicon dioxide adjoining the semiconductor body and silicon nitride over the silicon dioxide.

In one embodiment of this invention the process is used to make a CMOS structure in a P type substrate. A P type epitaxial layer of silicon is used as the semiconductor body into which the circuits are built. A layer of silicon dioxide is formed on the epitaxial layer and a layer of silicon nitride is formed on the silicon dioxide layer. A layer of polycrystalline silicon ("polysilicon") is then formed over the silicon nitride layer. The desired pattern for the field isolation regions is formed over the polysilicon layer and the structure is etched to remove the polysilicon and a portion of the silicon nitride layer from the areas of the structure where the field isolation regions are to be formed. The resulting structure includes a nitride layer having relatively thin portions over the areas where field isolation regions are to be formed and relatively thick portions over areas where the active device regions are to be formed. A photoresist mask is then formed to define on the polysilicon and silicon nitride layers the position of N-well regions, leaving the areas preselected for the N-well regions exposed. At this time the exposed polysilicon portions may be removed prior to the formation of the N-well region. The removal of these polysilicon portions at this point in the process is optional. An N-type conductivity determining dopant is implanted through the exposed silicon nitride (and polysilicon portions if not previously removed) and into the epitaxial layer, using the photoresist mask as an ion implantation mask protecting the remaining portion of the structure. A lift-off material, (such as polysilicon), which is chosen to withstand relatively high temperatures (about 1000° C.) is deposited over the structure through conventional lift-off techniques, and the photoresist with excess lift-off material is lifted off (removed) from the structure. The N-well dopant can then be driven-in through annealing to form the N-well regions. P-type dopants are implanted into the epitaxial layer portions which are covered by the relatively thin silicon nitride portions using the relatively thick silicon nitride portions which are covered by a polysilicon portion and the lift-off material as an ion implantation mask. This forms the doped field isolation regions. The lift-off material is then removed using conventional chemical etching techniques. During this etching the silicon nitride layer protects the underlying regions in the epitaxial layer from etching. A blanket reactive ion etching (RIE) step is then used to partially remove the silicon nitride layer exposing the pad oxide everywhere except the areas defined for the active regions which areas were covered by the relatively thick silicon nitride portions. Following the blanket RIE step even the relatively thick silicon nitride portions become thinner but there is left behind enough silicon nitride to protect from oxidation the epitaxial layer regions which are to be used for the of active devices. Following the oxidation of the field isolation regions (i.e. to form semi-recessed oxide regions - "SROX") the remaining silicon nitride portions are removed and through conventional CMOS processing techniques both N-channel and P-channel devices are formed in the defined active device regions.

In one variation of this process there is an extra step of forming a pad pyrolytic silicon dioxide layer between the silicon nitride layer and the pad polysilicon layer to act as an etching mask during the removal of the relatively thin silicon nitride portions without this pyrolytic silicon dioxide layer, the thickness of the relatively thick silicon nitride portion is reduced during the removal of the relatively thin silicon nitride portions. This pad pyrolytic silicon dioxide is patterned like the pad polysilicon as will be explained during a detailed description of a preferred embodiment of the invention.

BRIEF DESCRIPTION OF THE DRAWINGS

FIGS. 1 through 7 illustrate sequential steps of making CMOS device according to present invention.

DESCRIPTION OF THE PREFERRED EMBODIMENTS

Figure 1:
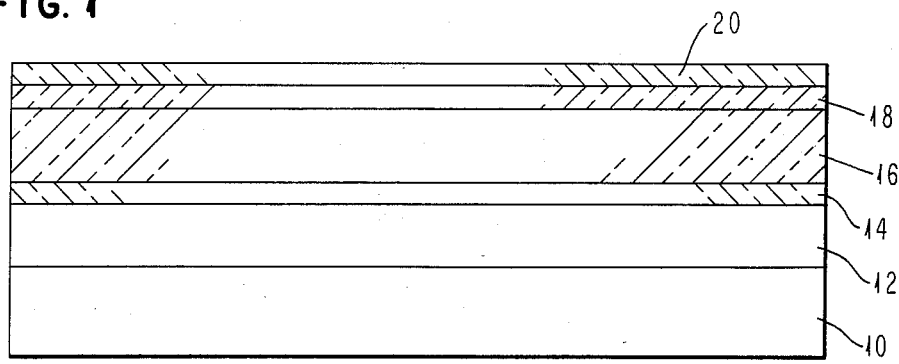
Figure 3:
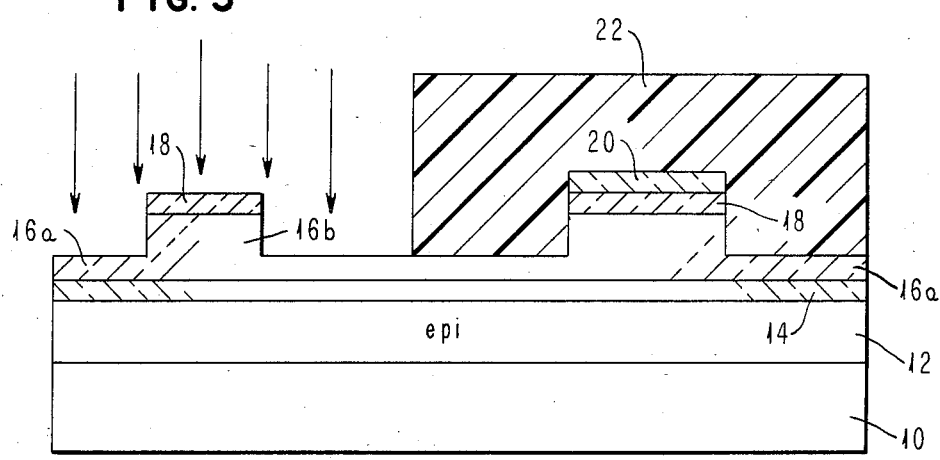

Referring now to FIG. 1, there is shown a semiconductor substrate 10, which may be made of a P+ conductivity type silicon and an epitaxial semiconductor layer ("epi") 12, preferably of P− type silicon, grown on substrate 10. A thin layer of silicon dioxide 14 ("pad oxide") is grown on the epitaxial layer 12 and a layer of silicon nitride 16 is deposited, preferably by conventional Low Pressure Chemical Vapor Deposition ("LPCVD") techniques, on the silicon dioxide layer 14. A layer of pyrolytic silicon dioxide 18 ("pad pyro") may be deposited on silicon nitride layer 16. As discussed earlier, silicon dioxide layer 18 is an optional layer the presence of which is useful during a subsequent part of the process when portions of the underlying silicon nitride layer have to be removed. A layer of polycrystalline silicon ("polysilicon") 20 preferably undoped, is then deposited on the silicon dioxide layer 18, preferably by LPCVD techniques. The epitaxial layer 12 may have a thickness in the range of 1 to 15 micrometers and a resistivity in the range of 5 to 50 ohm-centimeters. The silicon dioxide layer 14 may have a thickness of about 50 nanometers and the silicon nitride layer 16 may have a thickness of about 100 nanometers. The pyrolytic silicon dioxide layer 18 may have a thickness of 50 nanometers and polysilicon layer 20 may have a thickness of 150 nanometers. At this point, the N-well regions, which are not shown, may be defined over the structure through an ion implantation step. The N type dopants may be implanted into these regions. This step is an optional step at this point since the N-well implantation may take place at a different point in the process as shown in FIG. 3.

Figure 2:
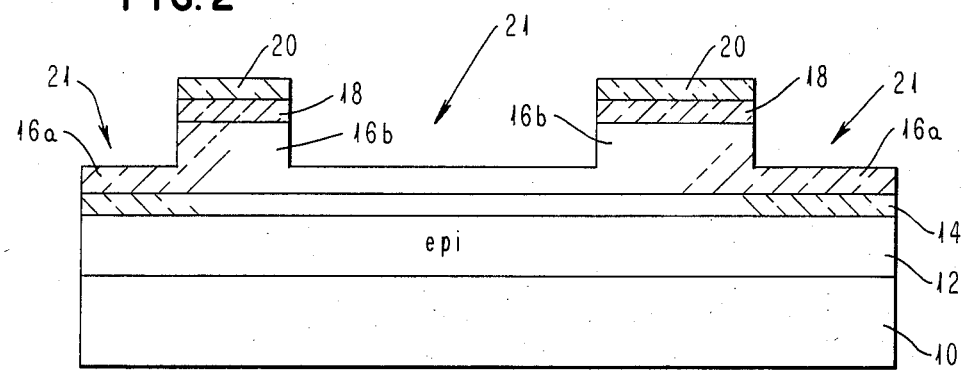
Figure 4:
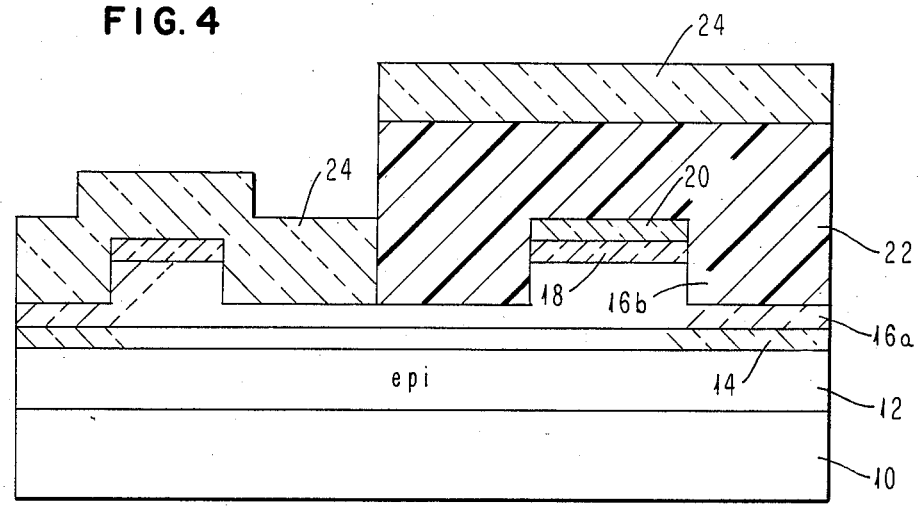
Figure 5:
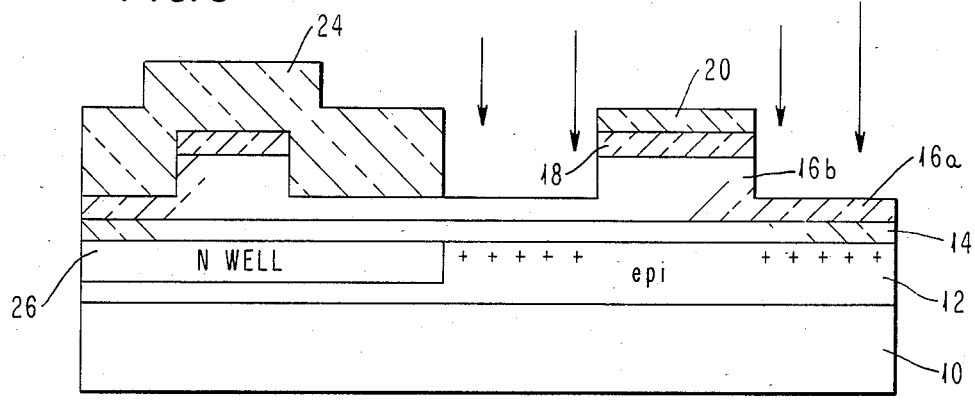
Figure 6:
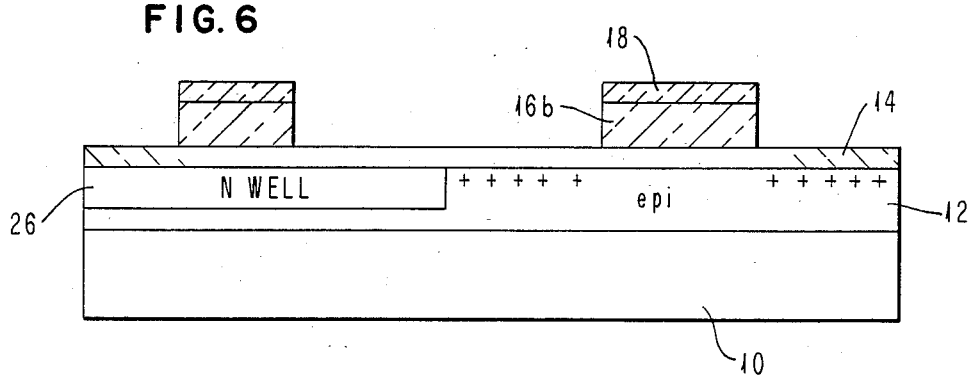

With a conventional photoresist mask, not shown, openings 21 are formed in the polysilicon layer 20, the pyrolytic oxide 18 and partially through the silicon nitride layer 16 to define the position of the field isolation regions of the structure. The removal of the polysilicon, the oxide and the partial removal of the silicon nitride layer may be accomplished by conventional reactive ion etching techniques. For example, a reactive gas mixture of carbon tetrafluoride ($CF_4$) and carbon dioxide ($CO_2$) or $CF_4$ and $O_2$ or some other equivalent reactive gas mixture may be used to etch the polysilicon. A reactive gas mixture of $CF_4$ and $H_2$ or an equivalent may be used to remove the pyrolytic oxide and a reactive gas mixture of $CF_4$ and $O_2$ or an equivalent may be used to remove the silicon nitride. The photoresist mask is then stripped using, for example oxygen plasma techniques, and the surface of the remaining structure is cleaned using known cleaning techniques. The resulting structure is shown in FIG. 2. The nitride layer has now relatively thin portions 16a and relatively thick portions 16b. The relatively thin portions 16a may have a thickness which is 20 to 50% of the thickness of the relatively thick portions 16b. A photoresist mask 22, illustrated in FIG. 3, is formed over the structure with openings defining the position of the N well regions. If N type dopants have not been implanted into the N-well regions at an earlier step then at this point, N-type ions, such as phosphorous ions (P+) are implanted into the openings of photoresist mask 22. A new layer of polysilicon 24 is preferably, directionally evaporated over the photoresist mask 22, as shown in FIG. 4. This layer may have a thickness of about 380 nanometers. The portion of layer 24 deposited over the photoresist mask 22 is removed along with the photoresist mask 22, using known lift-off techniques, and the N type dopants implanted into the N-well regions are driven-in into the epitaxial layer 12 through conventional annealing techniques in an inert atmosphere, such as in $N_2$ at 1100° C. for about 11 hours, in order for the N-well regions to reach a preselected doping profile 26 as shown in FIG. 5. Using the relatively thick silicon nitride portions 16b and the evaporated silicon layer 24 as an ion implantation mask, P type ions, such as boron (B+) are implanted into the epitaxial layer 12 through the relatively thin silicon nitride portions 16a to form the doped field isolation regions shown in FIG. 5. The polysilicon layer 24 is then removed through a wet chemical etching step such as, for example through the use of a solution containing 7 parts nitric acid ($HNO_3$), 4 parts water ($H_2O$) and 1 part of buffered hydrofluoric acid (HF). A blanket reactive ion etching step, using for example a reactive gas mixture of $CF_4$ and $O_2$, is then used to remove all relatively thin portions 16a of the silicon nitride layer resulting in the structure of FIG. 6 wherein the relatively thick silicon nitride portions 16b remained over the defined active regions because they were protected by the silicon dioxide portions 18 during the reactive ion etching step that removed the exposed relatively thin silicon nitride portions everywhere else on the structure.

Although silicon nitride was the oxygen impervious layer used in the above embodiment of the invention other oxygen impervious materials, such as for example, silicon oxynitride ($Si_xO_yN_z$), preferably having an index of refraction with a range of 1.7 to 2.0, may be used with this process. Thus, it should be understood that the invention is not be limited to these particular process steps, their sequence, or the final structures depicted in the drawings. On the contrary, it is intended to cover all alternatives, modifications and equivalents, as may be included within the spirit and scope of the invention as defined in the appended claims.

What is claimed is:

1. A process of making a semiconductor structure comprising:
   providing a semiconductor body;
   forming on a surface of said semiconductor body a first masking layer from a material preselected to be impervious to oxygen diffusion therethrough;
   defining on said first masking layer the position of active and field isolation regions to be subsequently formed on said semiconductor body, by partially removing portions of said layer from areas defined for the field isolation regions to thereby establish in said layer relatively thick portions over the positions of said active regions and relatively thin portions over the positions of said field isolation regions;
   forming and patterning a second masking layer which exposes a first portion of said first masking layer;
   implanting dopant ions to form first doped regions in portions of said semiconductor body beneath said relatively thin portions of said portion of said first masking layer exposed by said second masking layer;
   forming and patterning a third masking layer which exposes a second portion of said first masking layer; and
   implanting dopant ions to form second doped regions in portions of said semiconductor body beneath said relatively thin portions of said portion of said first masking layer exposed by said third masking layer.

2. A process as set forth in claim 1 wherein said masking layer is a dual dielectric layer consisting of a layer of silicon dioxide formed on said semiconductor body and a layer of silicon nitride formed on said silicon dioxide layer.

3. A process as set forth in claim 1 wherein said masking layer is a layer of silicon oxynitride.

4. A process as set forth in claim 1 wherein said masking layer is a dual dielectric layer consisting of silicon dioxide adjoining said semiconductor layer and a layer of silicon oxynitride adjoining said silicon dioxide layer.

5. A process as set forth in claim 2 wherein said semiconductor body is silicon epitaxially formed on a silicon substrate.

6. A process as set forth in claim 2 wherein said relatively thin portions in said silicon nitride layer have a thickness which is in the range of 20 to 50% of the thickness of the remaining silicon nitride layer.

7. A process of fabricating a complementary metal oxide semiconductor (CMOS) structure comprising the steps of:
   forming a first masking structure on a surface of a semiconductor body said masking structure made to be impervious to oxygen diffusion therethrough;
   patterning said first masking structure to define the position of active regions and field isolation regions to be subsequently formed on said semiconductor body, by partially removing portions of said first masking structure to define relatively thick and relatively thin portions thereof, said relatively thin portions of said first masking structure defining said field isolation regions,
   forming and patterning a second masking layer on said first masking structure to define by exposing first areas of said first masking structure the position of first conductivity type regions;
   implanting a first type conductivity determining impurity into said semiconductor body, using said second masking layer and said relatively thick portions of said exposed first areas of said first masking structure as an ion implantation mask;
   removing said second masking layer;
   forming a third masking layer covering said first conductivity type regions and exposing second areas of said first masking structure;
   implanting a second type conductivity determining mining impurity into said semiconductor body using said third masking structure and said relatively thick portions of said exposed second areas of said first masking structure as an ion implantation mask to allow the implantation of ions into portions of said field isolation regions outside the first conductivity type regions;
   removing said third masking layer; and
   removing said relatively thin portions of said first masking structure so that said relatively thick portions of said first masking structure cover only the areas defined on said structure for said active regions.

8. A process as set forth in claim 7 wherein said semiconductor body is an epitaxial layer of silicon having a P type conductivity formed on a silicon substrate having a P type conductivity.

9. A process as set forth in claim 7 wherein:
   said first masking layer is a dual dielectric structure consisting of a layer of silicon dioxide formed on a surface of said epitaxial layer and a layer of silicon nitride formed on said silicon dioxide layer;
   said second masking layer is a layer of a photoresist material;
   said third masking layer is a layer of silicon.

10. A process as set forth in claim 9 wherein said first masking layer is a layer of oxynitride.

11. A process as set forth in claim 9 wherein said first masking layer is a layer of an oxynitride material having an index of refraction between 1.7 to 2.0.

12. A process of making a Complementary Metal Oxide Semiconductor (CMOS) structure comprising the steps of:

forming a layer of silicon dioxide on a surface of a semiconductor body;

forming a layer of silicon nitride on said silicon dioxide layer;

forming a layer of polycrystalline silicon over said nitride layer;

forming a layer of pyrolytic silicon dioxide over said polycrystalline layer;

forming openings in said polycrystalline silicon layer to define the position of said field isolation regions and partially removing the exposed portions of said silicon nitride layer, thereby establishing in said silicon nitride layer relatively thin portions over areas preselected for the formation of field isolation regions and relatively thick portions over areas preselected for the formation of active regions;

forming a photoresist layer over the resulting structure and patterning said layer with openings defining the areas of N conductivity type well regions;

introducing N type conductivity determining ions into said semiconductor body through said openings in said photoresist layer to form N conductivity type well regions in said semiconductor body, using said photoresist layer as an ion implantation mask;

forming on said N well regions and on said photoresist layer a layer of a lift-off material and then removing the remaining photoresist layer together with the lift-off material thereon;

annealing said semiconductor body to form the desired doping profiles in said N well regions;

implanting said body with P type conductivity determining ions using said relatively thick portion of said silicon nitride layer which are covered by said polycrystalline silicon as an ion implantation mask to form P type implanted regions in portions of said field isolation regions outside said N well regions;

removing said lift-off material, the exposed polycrystalline silicon material and the exposed portions of said silicon nitride layer, exposing said silicon dioxide layer over said field isolation regions while retaining a portion of said silicon nitride over the areas defined for said active regions.

* * * * *